United States Patent
Marbot et al.

(10) Patent No.: US 6,175,885 B1
(45) Date of Patent: Jan. 16, 2001

(54) SYSTEM FOR SERIES TO PARALLEL CONVERSION OF A LOW-AMPLITUDE AND HIGH FREQUENCY SIGNAL

(75) Inventors: Roland Marbot, Sassenage; Pascal Couteaux, Grenoble; Michel D'Hoe, Fontaine; Jean-Claude Le Bihan, Grenoble; Francis Mottini, Crolles; Réza Nezamzadeh, Meylan; Anne Pierre-Duplessix, Grenoble, all of (FR)

(73) Assignee: SGS-Microelectronics S.A., Gentilly (FR)

( * ) Notice: Under 35 U.S.C. 154(b), the term of this patent shall be extended for 0 days.

(21) Appl. No.: 08/972,002

(22) Filed: Nov. 17, 1997

(30) Foreign Application Priority Data

Nov. 19, 1996 (FR) .................................................. 96 14344

(51) Int. Cl.[7] .............................. G06F 13/00; H03M 9/00
(52) U.S. Cl. ................................. 710/71; 710/58; 710/71; 327/91; 327/94; 341/100
(58) Field of Search .................................... 710/7, 58, 60, 710/71, 66; 327/94, 96, 91; 341/61, 100, 101

(56) References Cited

U.S. PATENT DOCUMENTS

| | | | |
|---|---|---|---|
| 3,961,138 | 6/1976 | Fellinger | 178/69.5 R |
| 5,003,561 | 3/1991 | Dragotin | 375/119 |
| 5,060,239 | * 10/1991 | Briscoe et al. | 375/260 |
| 5,101,203 | * 3/1992 | Gersbach et al. | 341/100 |
| 5,170,074 | 12/1992 | Aoki | 307/279 |
| 5,253,254 | * 10/1993 | Roberts et al. | 375/368 |
| 5,557,272 | * 9/1996 | Riggio, Jr. | 341/100 |
| 5,648,776 | * 7/1997 | Widmer | 341/100 |
| 5,721,545 | * 2/1998 | Poplevine | 341/100 |
| 5,744,985 | * 4/1998 | Nishida | 327/94 |
| 5,799,211 | * 8/1998 | Hakkarainen et al. | 710/71 |

FOREIGN PATENT DOCUMENTS

| | | | |
|---|---|---|---|
| 0 397 198 | 11/1990 | (EP) | H03M/9/00 |
| 0 472 426 | 2/1992 | (EP) . | |

OTHER PUBLICATIONS

French Search Report from French application No. 96 14344, filed Nov. 19, 1996.
Structure et Technologie Des Ordinateurs, Armand Colin, Paris Xp002033650. pp. 431–439.

* cited by examiner

Primary Examiner—Thomas C. Lee
Assistant Examiner—Chun Cao
(74) Attorney, Agent, or Firm—Wolf, Greenfield & Sacks, P.C.; James H. Morris; Theodore E. Galanthay

(57) ABSTRACT

Disclosed is a device for the conversion of a series signal received in the form of a low-amplitude, high-frequency differential signal into n parallel signals. The device uses a scheme derived from that of a static memory cell as a sample-and-hold unit and amplifier. The device continues to perform well when the differential signal comprises noise in common mode.

10 Claims, 2 Drawing Sheets

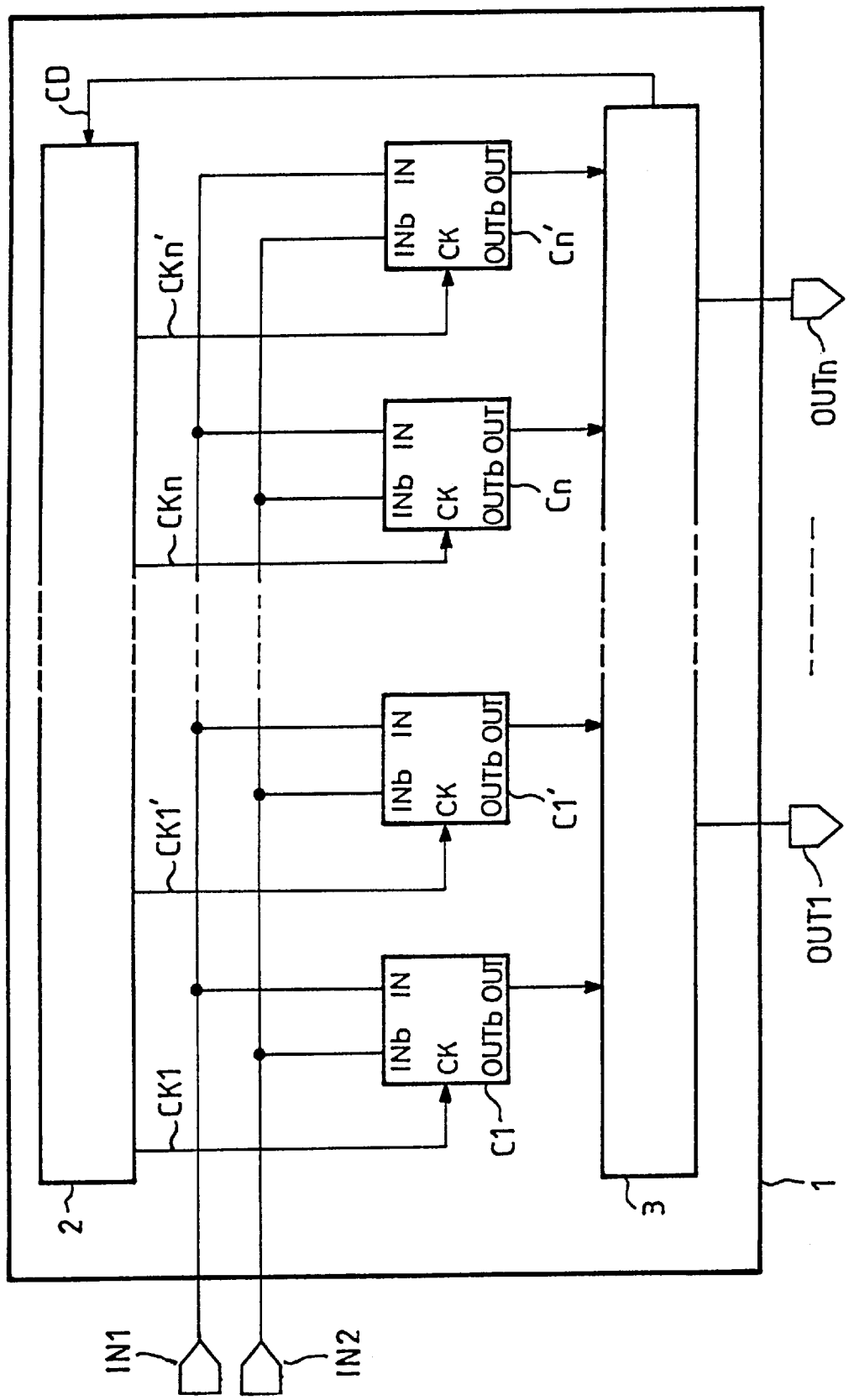
FIG_1

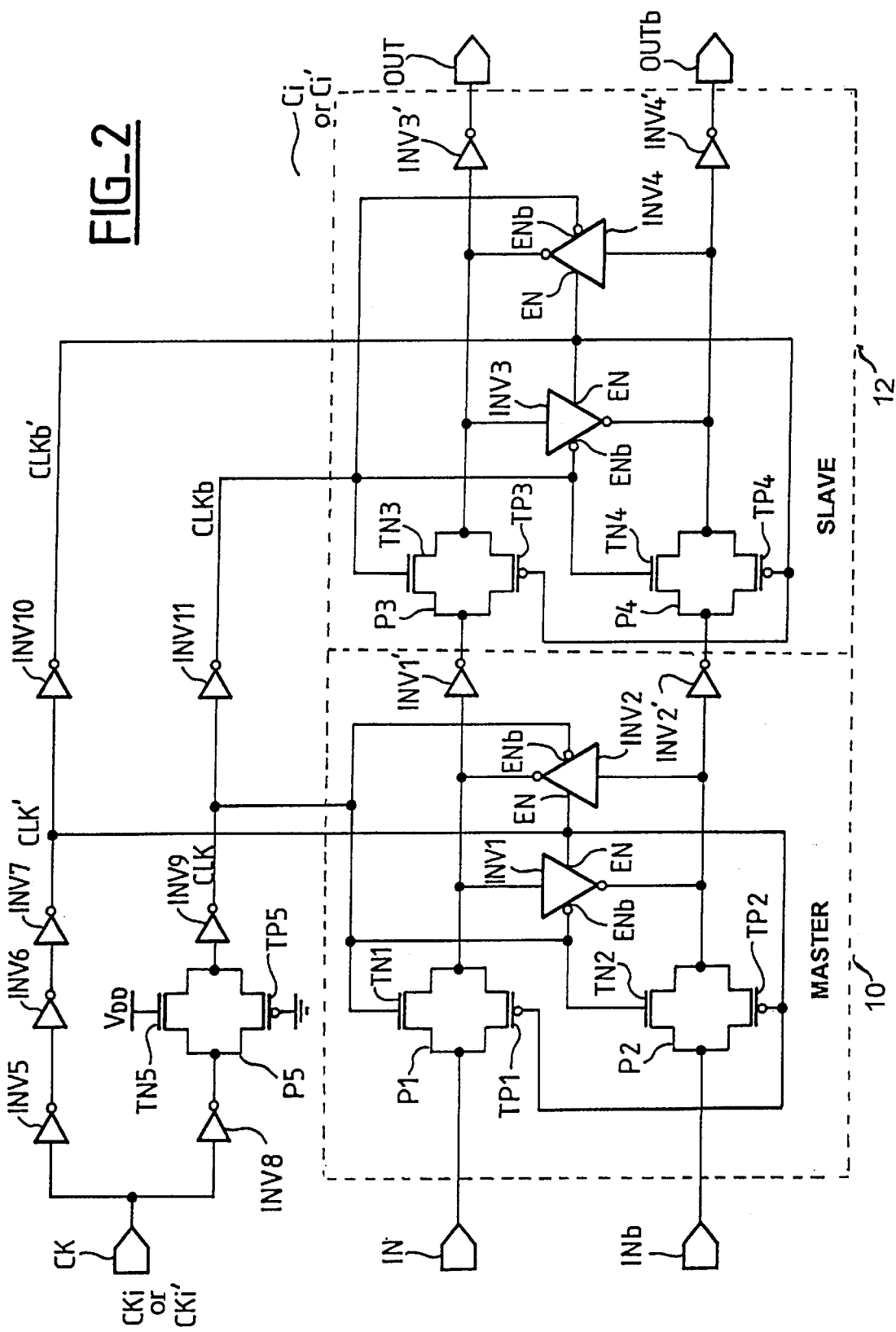
FIG_2

SYSTEM FOR SERIES TO PARALLEL CONVERSION OF A LOW-AMPLITUDE AND HIGH FREQUENCY SIGNAL

BACKGROUND OF THE INVENTION

1. Field of the Invention

The present invention relates to a device for the conversion of a series signal received in the form of a low-amplitude, high-frequency differential signal into a number, n, of parallel signals. The invention can be applied more particularly in the field of serial data reception.

The use of a differential signal is particularly suited to the transmission of data elements in series links. Disturbances, such as distortions and noise, that appear during the transmission of the signal act without distinction on the two signals that form the differential signal, and therefore do not cause any deterioration in the information to be transmitted which constitutes the difference between the two signals.

The conversion device as described in the present application is used to convert a high-frequency and low-amplitude differential signal representing a string of bits into n parallel logic signals.

2. Description of the Prior Art

Known conversion devices generally have a differential input to receive a series differential signal with a period T. This signal is applied to the inputs of a differential amplifier so as to transpose it to two logic levels Vdd and Vss. The converted signal is then sampled by a set of n master/slave registers which are parallel-connected to the output of the amplifier. The sampling period of the registers is taken to be equal to nT and the sampling signals of the n master/slave registers are staggered with respect to one another by a time interval equal to the period T of the differential signal. Thus, at the output of the n master/slave registers, there are obtained n samples of the series signal staggered by a time interval T.

For example, for the conversion of a string of bits received at a frequency of 100 KHz in 10-bit words, the conversion device has ten master/slave registers that sample the string of bits at a frequency of 10 KHz and the sampling instants of these different registers are staggered by 10 $\mu$s with respect to each other.

However, this type of device does not work satisfactorily when the frequency of the string of bits received is high, in the range of one gigahertz. At this frequency, the differential amplifier introduces an instability in the time base of the signal received and therefore shifts the edges of the series signal. This phenomenon is accentuated when the differential signal applied to the input of the amplifier contains noise in common mode. The result is that the samples obtained at the output of the master/slave registers may, in certain cases, no longer represent the initial string of bits.

SUMMARY OF THE INVENTION

An aim of the invention, therefore, is a conversion device by which it is possible to do away with the need to use a differential amplifier to transpose the input differential signal to two logic levels.

Thus, an object of the invention is a device for the series-to-parallel conversion of a series signal received in the form of a low-amplitude, high-frequency differential signal with a period T, this device being designed to convert the series signal into n parallel logic signals. The device comprises a series input consisting of a first input terminal and a second input terminal, the differential signal being received between the first and second input terminals, a parallel output consisting of n output terminals to deliver the n parallel signals, and a clock circuit to deliver n clock signals with a period nT that are staggered with respect to one another by a time interval equal to T. The device further comprises n sample-and-hold units which obtain samples of the series signals staggered with respect to one another by a time interval equal to T, each sample-and-hold unit comprising a first input and a second input respectively connected to the first and second input terminals, a control input to receive one of the n clock signals and an output connected to one of the output terminals of the parallel output to deliver a sample. The sample-and-hold units simultaneously amplify the samples of the series signal.

To obtain this amplification and transpose the samples to two logic levels, static memory cells are used as sample-and-hold units. Thus, each sample-and-hold has a master part to sample the series signal and amplify the resulting samples, and a slave part to store the samples.

According to a preferred embodiment, the master part comprises a first connection gate connected, on the one hand, to the first input of the sample-and-hold unit and, on the other hand, to the input of a first inverter and to the output of a second inverter. The master part further comprises a second connection gate connected, on the one hand, to the second input of the sample-and-hold unit and, on the other hand, to the output of the first inverter and to the input of the second inverter. The first and second connection gates are controlled by a first pair of control signals coming from the clock signal applied to the control input of the sample-and-hold unit.

Furthermore, the slave part of the sample-and-hold unit preferably has a third connection gate connected, on the one hand, to the input of the first inverter of the master part and, on the other hand, to the input of a third inverter, the output of the fourth inverter and the first output of the sample-and-hold unit. The slave part further comprises a fourth connection gate connected, on the one hand, to the output of the first inverter and, on the other hand, to the output of the third inverter and the input of the fourth inverter. The third and fourth connection gates are controlled by a second pair of control signals coming from the clock signal applied to the control input of the sample-and-hold unit.

In most cases, the conversion of the series signal received cannot be limited solely to a resetting of the signal at two logic levels and to the sampling of this signal. It is also necessary to resynchronize the received signal, namely to place the edges of the sampling signals in phase with the clock signal associated with the received signal.

The technique used to resynchronize the received series signal with a frequency f consists of sampling the signal at the frequency 2f. Since the received signal represents a string of bits, each bit is thus sampled twice. The aim of this technique is to identify the instants of transition between the bits of the received signal and then adapt the sampling of the signal as a function of these instants.

Since the invention makes it possible not to introduce any instability into the time base of the signal received at the time of amplification, it is particularly suited to conversion devices comprising means for the recovery of the clock signal from the received series signal. This is why, according to one preferred embodiment, the clock circuit delivers n additional clock signals with a period nT, giving a total of 2n clock signals, with a period nT, that are staggered with respect to one another by a time interval equal to T/2.

The conversion device further comprises n additional sample-and-hold units to obtain a total of 2n samples of the series signal staggered with respect to one another by a time interval equal to T/2, a logic processing and decision circuit to process the 2n samples of the series signal and determine whether the series signal has been accurately sampled with respect to the time periods. The processing and decision circuit comprises 2n inputs connected to the outputs of the 2n sample-and-hold units, n outputs connected to the n output terminals of the device and one control output delivering a control signal to the clock circuit to stagger the clock signals until an accurate sampling of the series signal is obtained.

According to another embodiment of the invention, a device for converting a series input signal to a parallel output signal is disclosed. The device comprises a first plurality of sampling devices for obtaining a number of first samples of the series signal, the first plurality of sampling devices being controlled by a timing signal of a clock device, a second plurality of sampling devices for obtaining a number of second samples of the series signal, the second plurality of sampling devices being controlled by the timing signal of the clock device, each of the second plurality of sampling devices being arranged to obtain samples of the series signal between samples obtained by each of the first plurality of sampling devices and a processor which receives the number of first samples and the number of second samples and outputs a parallel signal, wherein the processor determines when a transition occurs between consecutive first samples, and outputs a control signal to the clock device, the control signal causing the clock device to vary the timing signal, such that the plurality of second samples are taken during each transition.

The processor determines the occurrence of a transition by comparing each of the plurality of second samples with the first sample which precedes each second sample and the first sample which succeeds each second sample. If the logic level of the second sample is the same as the logic level of the preceding first sample and different from the logic level of the succeeding first sample, the processor instructs the clock device to shift the clock signal forward. If the logic level of the second sample is different from the logic level of the preceding first sample and the same as the logic level of the succeeding first sample, the processor instructs the clock device to delay the clock signal.

BRIEF DESCRIPTION OF THE DRAWINGS

Other features and advantages of the invention shall appear from the following detailed description made with reference to the appended drawings, of which:

FIG. 1 shows a preferred embodiment of the conversion device according to the invention; and FIG. 2 is a drawing of a sample-and-hold unit according to the invention.

DETAILED DESCRIPTION

FIG. 1 shows a conversion device according to the invention which is capable of converting a low-amplitude, high-frequency series signal received in differential form into n parallel logic signals. This device 1 is equipped with a logic processing and decision circuit 3 and a programmable clock circuit 2 to resynchronize the clock signals of the device with the clock signal associated with the input signal.

The device 1 has a differential input consisting of two input terminals IN1 and IN2. The differential signal received between these two terminals is applied to the input of 2n sample-and-hold units C1 . . . Cn and C1' . . . Cn'. Each of these sample-and-hold units comprises two signal inputs IN and INb connected respectively to the input terminals IN1 and IN2 of the conversion device, two signal outputs OUT and OUTb, the output OUT of each sample-and-hold unit being connected to an input of the logic processing and decision circuit 3 and the output OUTb being left in a state of high impedance, and a control input CK to receive a clock signal CK1 . . . CKn or CK1' . . . CKn' from the programmable clock circuit 2.

Clock circuit 2 is controlled by a control signal CD from the logic processing and decision circuit 3. In practice, the clock circuit 2 consists of a clock, for example a quartz clock, and 2n delay elements series-connected with the output of the clock. If the series signal has a period T, then a clock with a period nT and delay elements introducing a delay of T/2 in the clock signal are chosen. The delay elements will then deliver clock signals staggered with respect to one another by T/2. Furthermore, the first delay element is programmable. To retrieve the edges of the clock signal associated with the series signal, the control signal CD will act on the programmable delay element to bring forward or delay the edges of the clock signals CK1 . . . CKn and CK1' . . . CK1'.

The logic processing and decision circuit 3 is a logic unit by which it is possible, from the samples obtained at the output of the sample-and-hold units, to deduce whether the edges of the clock signals CK1 . . . CKn and CK1' . . . CKn' should be brought forward or delayed.

This device works as follows: when a differential signal representing a string of bits is present between the input terminals IN1 and IN2, it is directly applied between the inputs IN and INb of each of the sample-and-hold units C1 . . . Cn and C1 ' . . . Cn'. The differential signal is then amplified and sampled twice per bit. Then 2n samples are obtained. These 2n samples are then processed by the circuit 3. The setting of the clock circuit is done at the beginning of transmission.

The operation of the circuit 3 shall be explained by means of an example using three samples. In this example, it is assumed that the first sample E1 and the third sample E3 pertain respectively to the value of the first bit and the second bit of the differential signal and that the second sample E2 pertains to the transition between these two bits. If E1=1, E2=0 and E3=0, it means that the transition occurs between the first sample and the second sample. In order that E2 may be sampled at the time of the transition, it is therefore necessary to delay the clock signals CK1 . . . CKn and CK1' . . . CKn'. In the same way, if E1=1, E2=1 and E3=0, the transition would have occurred between the second and third samples and it would have been necessary to bring the clock signals forward. Thus, it is sought to identify the instants of transition between each bit with precision to determine the instants at which the series signal must be sampled. When all 20 samples are processed, there are thus obtained 10 elementary decisions indicating whether the clock signals must be delayed or brought forward. The final decision that is transmitted to the clock circuit 2 is taken by majority. When 5 decisions are obtained to bring forward the clock signals and 5 decisions are obtained to delay them, then the synchronization of the clock signals can be deemed to have been completed.

A sample-and-hold unit C1, which corresponds to each of units C1 . . . Cn and C1' . . . Cn', is described with reference to FIG. 2. It has two identical cells, a master cell 10 and a slave cell 12. These cells repeat the structure of the static memory cells. The master cell 10 has two inverters INV1 and INV2 connected in parallel with each other. The input of the inverter INV1 is connected to the input of the terminal IN by means of a connection gate P1 which is formed by a P type MOS transistor TP1 and an N type MOS transistor TN1 that are parallel-connected. Similarly, the output of the inverter INV1 is connected to the input terminal INb by means of a connection gate P2 formed by two transistors TP2 and TN2. The master cell 10 furthermore has two output inverters INV1' and INV2'. The inputs of which are respectively connected to the input of the inverter INV1 and to the input of the inverter INV2. The outputs of INV1' and INV2' constitute the outputs of the master cell. The inverters INV1' and INV2' are used so that the fan-out of the master cell 10 overcomes the fan-out of the slave cell 12 during the transfer of the contents of the master cell 10 into the slave cell 12.

The slave cell 12 repeats the elements of the master cell 10. Only the references of the elements change. The elements referenced P3, P4, INV3, INV4, INV3', INV4', TN3, TN4, TP3 and TP4 of the slave cell 12 correspond respectively to the elements referenced P1, P2, INV1, INV2, INV1', INV2', TN1, TN2, TP1 and TP2 of the master cell 10. Furthermore, to set up the link between the two cells, the outputs of the inverters INV1' and INV2' are respectively connected to the input and to the output of the inverter INV3 by means of the connection gates P3 and P4. The outputs of the inverters INV3' and INV4' are respectively connected to the output terminals OUT and OUTb.

In a variant, the slave cell 12 could be limited to a standard latch circuit connected between the inverter INV1' and the output OUT of the sample-and-hold unit.

Preferably, the inverters INV1, INV2, INV3 and INV4 have activation inputs EN and ENb to control the enabling or disabling of the inverters.

Clock signals are used to control the switching open or closed of the connection gates P1, P2, P3 and P4, as well as to control the enabling or disabling of the inverters INV1, INV2, INV3 and INV4. All these signals come from a clock signal CKi given to the sample-and-hold unit Ci from clock circuit 2.

The clock signal CKi is processed, on the one hand, by three inverters INV5, INV6 and INV7 series-connected to give the signal CLK' and, on the other hand, by two inverters INV8 and INV9 and a connection gate P5 interposed between the inverters INV8 and INV9 to give the signal CLK. The signals CLK' and CLK are furthermore processed respectively by the inverters INV10 and INV1 to give the signals CLKb' and CLKb. The connection gate P5 consists of an N type transistor TN5 parallel-connected with a P type transistor TP5. The control gate of the transistor TN5 is connected to the supply potential Vdd and the control gate of the transistor TP5 is connected to the ground potential Vss. This gate is used so that the signals CLK and CLK' are very precisely in phase opposition.

The clock signal CLK is applied to the control gate of the transistors TN1 and TN2 as well as to the activation inputs ENb of the inverters INV1 and INV2. The clock signal CLK' is applied to the control gate of the transistors TP1 and TP2 as well as to the activation inputs EN of the inverters INV1 and INV2. The clock signal CLKb is applied to the control gate of the transistors TN3 and TN4 as well as to the activation inputs ENb of the inverters INV3 and INV4. The clock signal CLKb' is applied to the control gate of the transistors TP3 and TP4 as well as to the activation inputs EN of the inverters INV3 and INV4.

This description can also be applied to the sample-and-hold units Ci' controlled by the clock signals CK'i.

A description of the working of the circuit is given below. Since the slave cell 12 and the master cell 10 behave identically, the explanation will pertain solely to the working of the master cell 10.

Two signals S1 and S2 forming a low-amplitude differential signal with a frequency F are respectively applied to the inputs IN and INb and are respectively sampled by the connection gates P1 and P2 at the frequency F/n.

During the sampling stage, the connection gates P1 and P2 are closed and the inverters INV1 and INV2 are not enabled. The master cell is then equivalent to a pure capacitive load. Preferably, the transistors forming the connection gates are small-sized in order to limit the value of their capacitance and series resistance. The RC time constant resulting from the product of the capacitive load of the memory cell and the series resistance of the connection gates will be advantageously smaller than the transition time between the bits in order to ensure the transmission of high-frequency signals with minimum distortion.

When the connection gates P1 and P2 are open, the inverters INV1 and INV2 are put into operation. If the values V1, V2 of the two signals S1, S2, respectively, are included in the transition zone of the inverters INV1 and INV2, the two signals will then be amplified by the master cell 10 until one signal reaches the value Vdd and the other signal reaches the value Vss. Thus if, at the outset V1>V2, then at the end of the amplification V1 will have a value of Vdd and V2 will have a value of Vss.

If the values V1 and V2 of the signals S1 and S2 are not included in the transition zone of the inverters INV1 and INV2, then these values will first of all be brought into the transition zone of the inverters INV1 and INV2. Then the first value to reach this zone will enforce the decision. Similarly, if at the outset V1>V2, then V1=Vdd and V2=Vss will be obtained.

Simulations have shown that, to convert a low amplitude 1 Gbps signal into ten 100 Mbps parallel signals, the 5 ns phase allocated to the amplification of the signals is amply sufficient even if the amplitude of the differential signal is very low and even if the signals S1 and S2 have high noise in common mode.

For the efficient operation of the circuit, the signals CLK and CLK' must be very precisely in phase opposition. Otherwise, any phase shift might lead to an instability of the time base, especially when the differential signals comprise a voltage in common mode. When the voltage in common mode is close to the supply voltage Vdd, the N type transistor of each connection gate is at low impedance while the P type transistor is open. When the voltage in common mode is close to the ground potential Vss, the opposite is the case. Thus, if the clock signals CLK and CLK' do not switch over at the same point in time, then the instant of sampling will then depend on the voltage in common mode of the sampled signal.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A device for the series-to-parallel conversion of a series signal received in the form of a low-amplitude, high-frequency differential signal with a period T, the device being designed to convert said series signal into n parallel logic signals, the device comprising:

a series input comprising a first input terminal and a second input terminal, the differential signal being received between said first and second input terminals;

a parallel output comprising n output terminals to deliver the n parallel logic signals;

a clock circuit to deliver n clock signals with a period nT that are staggered with respect to one another by a time interval equal to T; and n sample-and-hold units for obtaining samples of said series signal staggered with respect to one another by a time interval equal to T, each sample-and-hold unit comprising a first input and a second input respectively connected to said first and second input terminals, a control input to receive one of said n clock signals and an output connected to one of the output terminals of the parallel output to deliver a sample;

wherein the sample-and-hold units simultaneously amplify the samples of said series signal;

wherein each sample-and-hold unit has a master part to sample said series signal and amplify the resulting samples, and a slave part to store said samples;

wherein the master part comprises:

a first connection gate connected, on the one hand, to the first input of the sample-and-hold unit and, on the other hand, to an input of a first inverter and to an output of a second inverter; and a second connection gate connected, on the one hand, to the second input of the sample-and-hold unit and, on the other hand, to an output of the first inverter and to an input of the second inverter;

wherein the first and second connection gates are controlled by a first pair of control signals coming from said clock signal applied to the control input of the sample-and-hold unit.

2. The conversion device according to claim 1, wherein the slave part of the sample-and-hold unit comprises:

a third connection gate connected, on the one hand, to the input of the first inverter of the master part and, on the other hand, to an input of a third inverter, an output of a fourth inverter and said output of the sample-and-hold unit; and a fourth connection gate connected, on the one hand, to the output of the first inverter and, on the other hand, to the output of the third inverter and to the input of the fourth inverter;

wherein the third and fourth connection gates are controlled by a second pair of control signals coming from said clock signal applied to the control input of the sample-and-hold unit.

3. The device according to claim 2, wherein the first and second pairs of control signals comprise two signals in phase opposition.

4. The device according to claim 2, wherein each of said connection gates is constituted by an N type transistor having a source and drain respectively connected to a source and to a drain of a P type transistor, control gates of each transistor each receiving one of the signals of each of said first and second pairs of control signals.

5. The device according to claim 1, wherein the clock circuit delivers n additional clock signals with a period nT, giving a total of 2n clock signals with a period nT that are staggered with respect to one another by a time interval equal to T/2, and wherein there are furthermore provided:

n additional sample-and-hold units to obtain a total of 2n samples of said series signal staggered with respect to one another by a time interval equal to T/2; and a logic processing and decision circuit to process the 2n samples of said series signal and determine whether the series signal has been accurately sampled with respect to the time periods, said circuit comprising 2n inputs connected to the outputs of the 2n sample-and-hold units, n outputs connected to the n output terminals of the device and one control output delivering a control signal towards the clock circuit to stagger said clock signals until an accurate sampling of the series signal is obtained.

6. A device according to claim 1, made by a CMOS technology.

7. A device for converting a series input signal to a parallel output signal, the device comprising:

a first plurality of sampling devices for obtaining a number of first samples of said series signal, said first plurality of sampling devices being controlled by a timing signal of a clock device;

a second plurality of sampling devices for obtaining a number of second samples of said series signal, said second plurality of sampling devices being controlled by said timing signal of said clock device, each of said second plurality of sampling devices being arranged to obtain samples of said series signal between samples obtained by each of said first plurality of sampling devices; and a processor which receives said number of first samples and said number of second samples and outputs a parallel signal, wherein said processor determines when a transition occurs between consecutive first samples, and outputs a control signal to said clock device, said control signal causing said clock device to vary said timing signal, such that said plurality of second samples are taken during each transition.

8. The device of claim 7, wherein said processor determines the occurrence of a transition by comparing each of said plurality of second samples with the first sample which precedes each second sample and the first sample which succeeds each second sample.

9. The device of claim 8, wherein, if the logic level of said second sample is the same as the logic level of said preceding first sample and different from the logic level of said succeeding first sample, said processor instructs said clock device to shift said clock signal forward.

10. The device of claim 9, wherein, if the logic level of said second sample is different from the logic level of said preceding first sample and the same as the logic level of said succeeding first sample, said processor instructs said clock device to delay said clock signal.

* * * * *

UNITED STATES PATENT AND TRADEMARK OFFICE
CERTIFICATE OF CORRECTION

PATENT NO. : 6,175,885B1  
DATED : January 16, 2001  
INVENTOR(S) : Roland Marbot, Pascal Couteaux, Michel D'hoe, Jean-Claude Le Bihan, Francis Mottini, Re'za Nezamzadeh and Anne Pierre-Duplessix It is certified that error appears in the above-identified patent and that said Letters Patent is hereby corrected as shown below:

On the title page, item [73] should read as follows:

[73] Assignee: SGS-Thomson Microelectronics S.A., Gentilly, France

Signed and Sealed this

Nineteenth Day of June, 2001

Attest:

NICHOLAS P. GODICI  
Attesting Officer    *Acting Director of the United States Patent and Trademark Office*